United States Patent [19]

Nishizawa et al.

[11] 3,946,270

[45] Mar. 23, 1976

[54] SIGNAL COLLECTING AND DISTRIBUTING SYSTEMS

[75] Inventors: Jun-ichi Nishizawa; Ichiemon Sasaki; Katsuhiko Ishida, all of Sendai; Syoji Tauchi, Kokubunji; Takeshi Nishimura, Kodaira; Takeo Seki, Kokubunji; Noboru Kozuma, Tokyo, all of Japan

[73] Assignees: Semiconductor Research Foundation, Sendai; Hitachi, Ltd., Tokyo, both of Japan

[22] Filed: Jan. 10, 1972

[21] Appl. No.: 216,532

Related U.S. Application Data

[62] Division of Ser. No. 616,385, Feb. 15, 1967, Pat. No. 3,634,849.

[30] Foreign Application Priority Data

| Feb. 19, 1966 | Japan | 41-9987 |
| Mar. 12, 1966 | Japan | 41-15163 |
| Mar. 25, 1966 | Japan | 41-18324 |
| Apr. 2, 1966 | Japan | 41-20528 |
| Apr. 25, 1966 | Japan | 41-25890 |
| Apr. 25, 1966 | Japan | 41-25891 |
| Apr. 25, 1966 | Japan | 41-25892 |

[52] U.S. Cl... 315/169 TV; 317/101 A; 315/169 R; 340/324 M
[51] Int. Cl.²................................. H05B 37/00
[58] Field of Search......... 313/109.5, 108 A, 108 B, 313/108 D; 315/169 R, 169 TV; 317/101 A; 340/324 M

[56] References Cited

UNITED STATES PATENTS

| 3,448,334 | 6/1969 | Schuster et al. | 250/220 M |
| 3,454,835 | 7/1969 | Rosvold | 317/101 A |
| 3,480,830 | 11/1969 | Horton et al. | 315/169 TV |

*Primary Examiner*—R. V. Rolinec
*Assistant Examiner*—Lawrence J. Dahl
*Attorney, Agent, or Firm*—Craig & Antonelli

[57] ABSTRACT

Signal collecting and distributing systems wherein an active transmission line possessing neuristor characteristics is provided as a means for scanning a plurality of signal transducers, which may be in the form of radiation sensitive elements or electroluminescent elements, respectively, to effect actuation thereof in a prescribed order.

5 Claims, 36 Drawing Figures

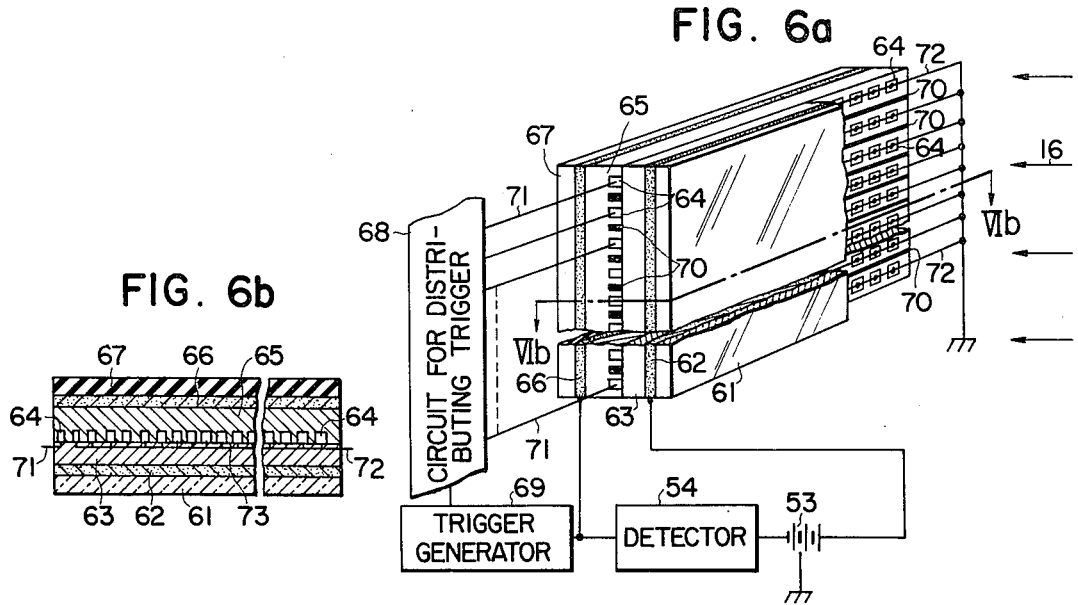
FIG. 6a
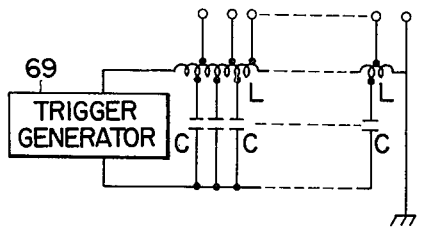
FIG. 6b
FIG. 6c
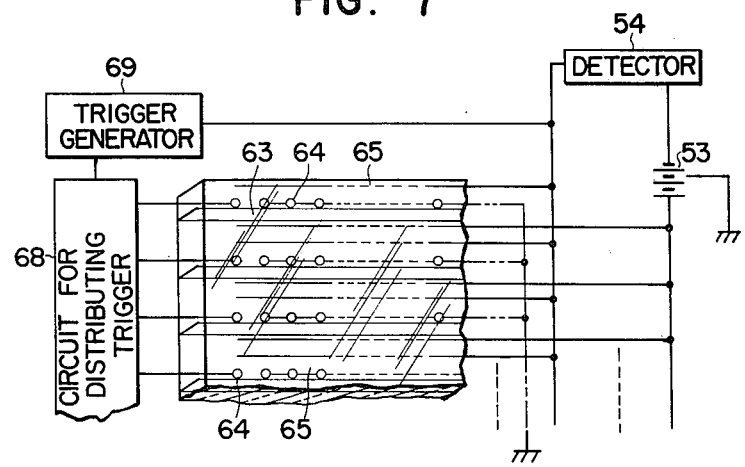
FIG. 7

SIGNAL COLLECTING AND DISTRIBUTING SYSTEMS

This is a division of application Ser. No. 616,385 filed Feb. 15, 1967, now U.S. Pat. No. 3,634,849.

This invention relates to signal collecting and distributing devices and more particularly to a device having functions by which a plurality of spacially distributed and arranged signal sources are selectively and successively switched and by which signals are collected into a single signal from said switched signal sources, and to a device having functions in which signals for selectively controlling operations of a plurality of spacially distributed systems to be controlled are distributed from a single composite signal.

Mechanical switches or delay lines employing means such as an electrical switch, a helix, or the like have long been used for appropriately switching a plurality of spacially distributed signal sources over to a transmission system from which signals from said signal sources are transmitted, and for receiving and redistributing said signals to spacially distributed control systems. These means, however, are imperfect because of their lack of high speed performance, poor signal-to-noise (S/N) ratio, or complexity of construction. For these reasons said means have not yet been put to practical use.

One of the objects of the present invention is to provide a signal collecting device by which signals delivered from large numbers of spacially distributed signal sources are simply and accurately collected.

Another object of this invention is to provide a signal collecting device by which switching functions can be carried out on plural signal sources over a sufficiently long time interval using a delay system capable of delaying signals to an extent that conventional means have never achieved.

Another object of this invention is to provide a signal collecting device by which switching signals for successively switching-on plural signal sources are transmitted to among plural signal sources at a constant speed and are reshaped without being attenuated.

Another object of the present invention is to provide a signal collecting device by which the signal-to-noise ratio of signals obtained from plural signal sources can be improved.

Another object of the present invention is to provide a signal collecting device the construction of which is extremely compact so taht integrated circuits may be incorporated into said device. One of the objects of the present invention is to provide a device for electrically distributing control signals simply and securely to numbers of spacially distributed controlled systems.

Another object of this invention is to provide a device capable not only of successively switching controlled systems one after another with a sufficiently long time interval to conform to conventional standards by successively applying switching signals to the controlled systems through a delay system, but also of distributing control signals to said controlled systems in synchronism with the switching signals.

Another object of this invention is to provide a signal distributing device in which switching signals for successively switching on a plurality of controlled systems are not attenuated but reshaped and successively transmitted at a constant speed to plural controlled systems in a sequential manner.

A further object of this invention is to provide a markedly compact signal distributing device which will permit incorporation of integrated circuits.

For the purpose of achieving the foregoing objects, one aspect of this invention consists of a system comprising spacially distributed signal sources of a plural number; a means by which signals from said signal sources are detected; a switching means which is provided in correspondence to each of said signal sources and by which signals from said signal sources are supplied selectively to said detecting means; and a means by which signals for controlling switching operations of said switching means are transmitted to said switching means. By establishing said switching signal transmission means composed of a delay line using an active transmission line, a device of this invention is able to perform a constant switching operation as well as to detect simply and accurately such signals as will be exceptionally superior in signal-to-noise characteristics.

In order to further achieve the above objects, another aspect of this invention consists of a system comprising a plurality of spacially disposed controlled systems; means providing sequential control signals for controlling the operations of the controlled systems; switching means in the form of an active transmission line capable of effecting accurately timed sequential connection between said controlled systems and said means providing control signals, and means for effecting the timed operation of said switching means. The controlled systems may take the form of electroluminescent panels capable of luminescence upon application thereto of a predetermined voltage.

A transmission line possessing neuristor characteristics is known wherein a delay system in the form of an active transmission line is used. This type of transmission line is described in the report "Neuristor — A Novel Device and System Concept" appeared in the Proceeding of the IRE 1962, Vol. 50, pages 2048 through 2060. The following features are read there:

1. Pulse propagation velocity is always constant.
2. Self-reshaping operation on a transmission line (i.e. width and height-reshaping on a signal determined by a circuit constant of said transmission line) is performed so that the pulse waveform is reshaped to a certain constant shape.
3. Voltage pulses of less than a certain specific voltage value are damped and eliminated.

The present invention has its features in the employment of means by which an active transmission line having features described above is used both as means to switch and supply signals delivered from said plural signal sources to aforementioned detecting means and also control the application of said signals to corresponding ones of distributed control systems.

Objects heretofore described and other additional objects and advantages will become clear from the following detailed description of the invention when taken in conjunction with the accompanying drawings which disclose several embodiments of the invention.

FIGS. 3a to 3d inclusive, illustrate embodiments of the invention based on the principles described in connection with the block diagram of FIG. 2.

Figure 4A:
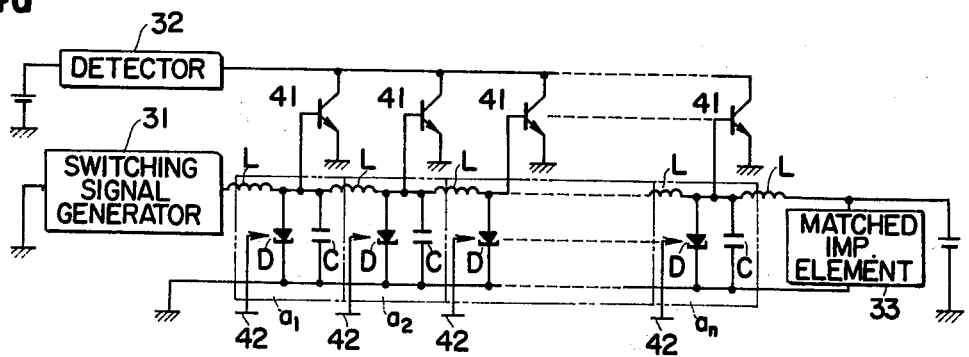
Figure 4B:
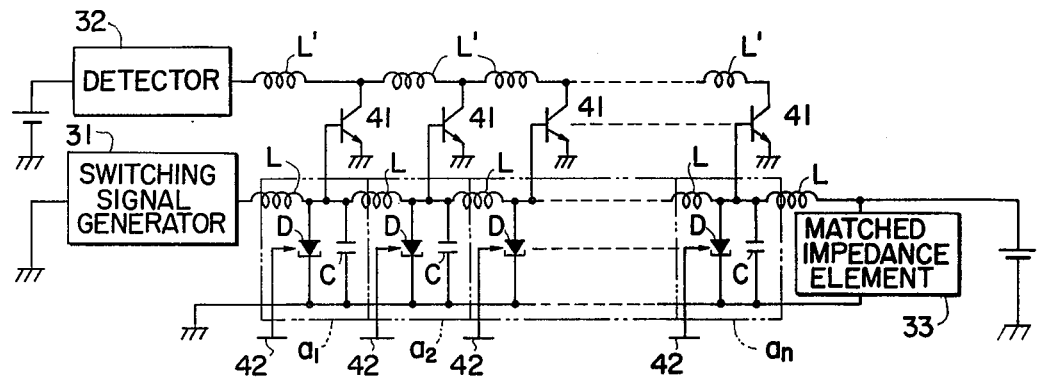
Figure 4C:
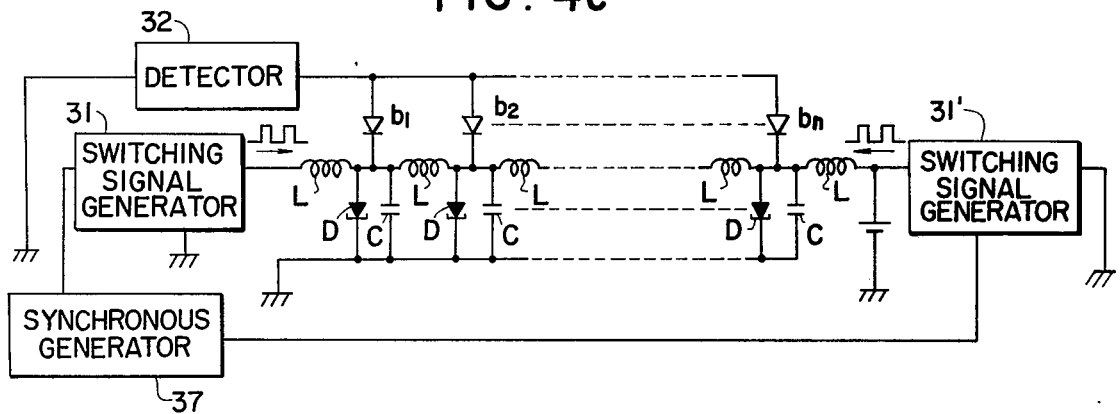

FIGS. 4a to 4c show other embodiments of the present invention.

Figure 5A:
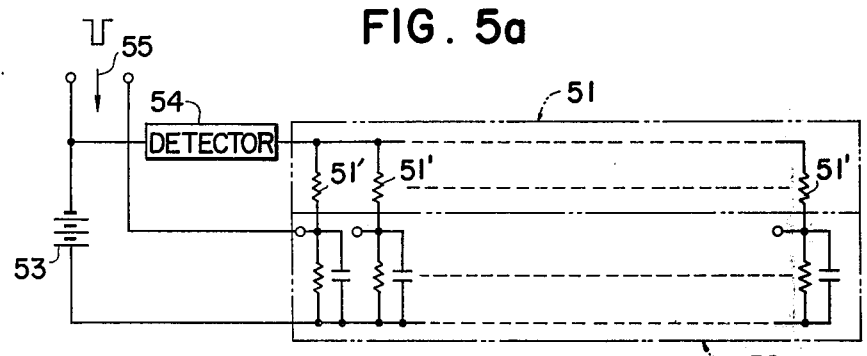
Figure 5B:
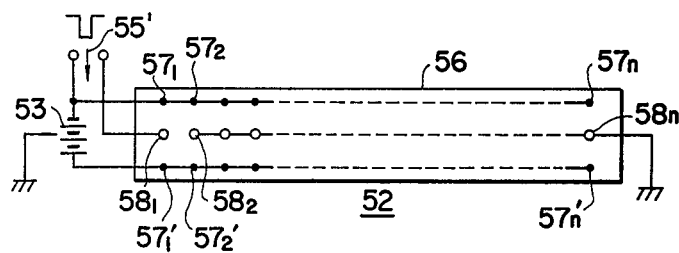

FIG. 5a shows an equivalent circuit providing a description of principles of another embodiment of the present invention;

FIG. 5b shows an exemplary construction of an active transmission line which is a component of FIG. 5a;

FIGS. 6a and 7 show integrated constructions in which the principles shown in connection with the system of FIG. 5a is employed;

FIG. 6b is a section of the construction of FIG. 6a taken along line 6b—6b.

Figure 3A:
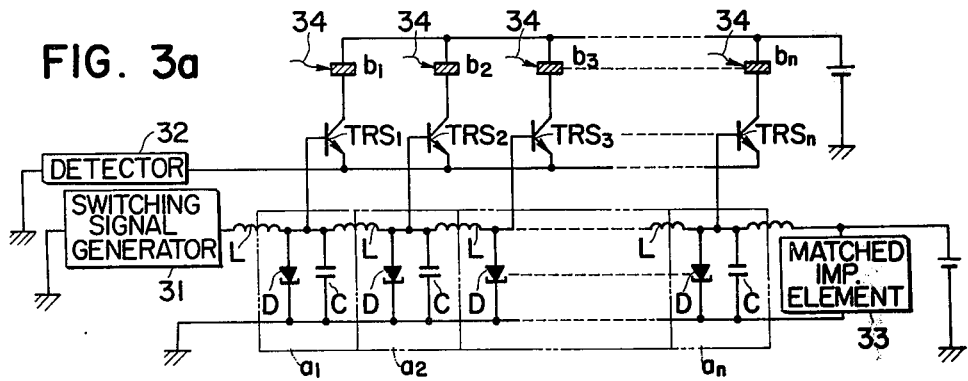
Figure 3B:
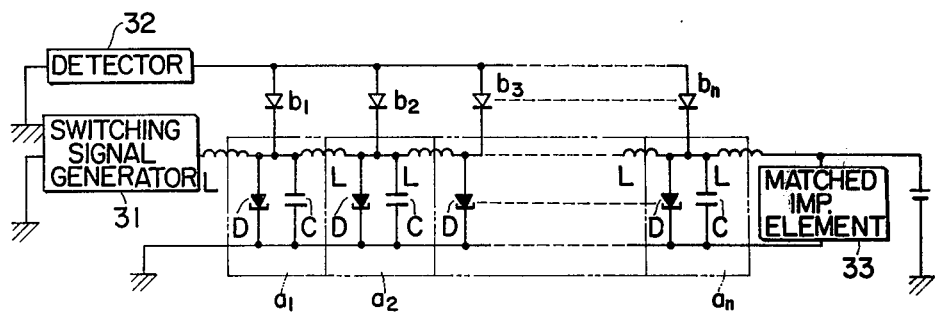
Figure 8A:
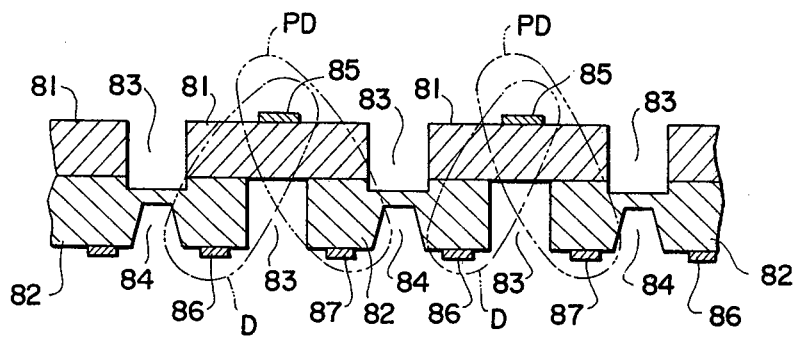
Figure 8B:
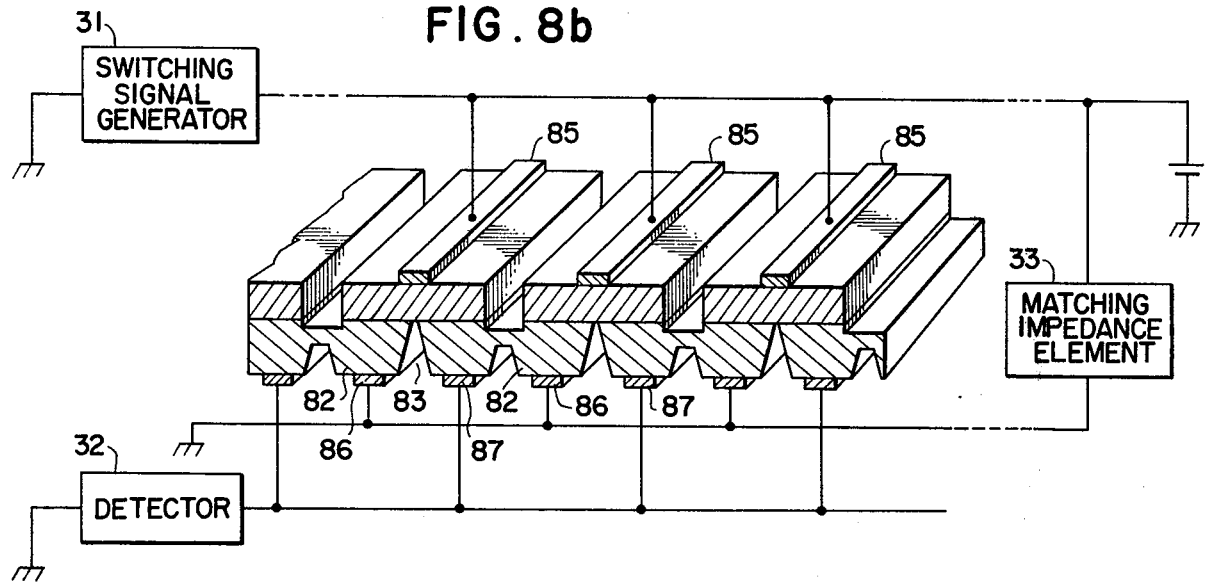
Figure 8C:
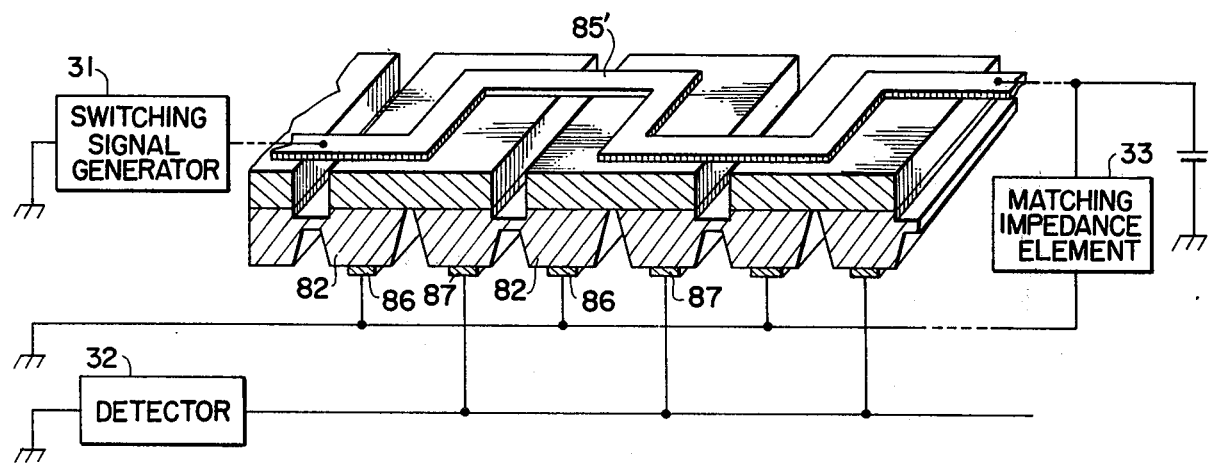
Figure 8D:
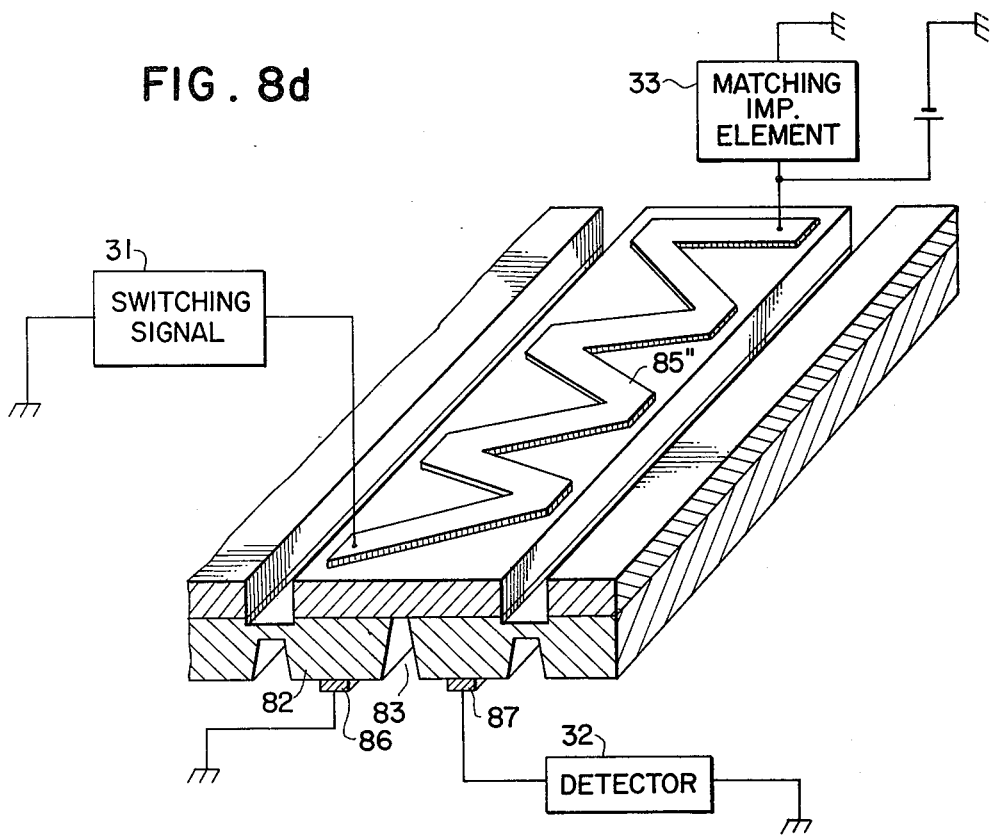
Figure 8E:
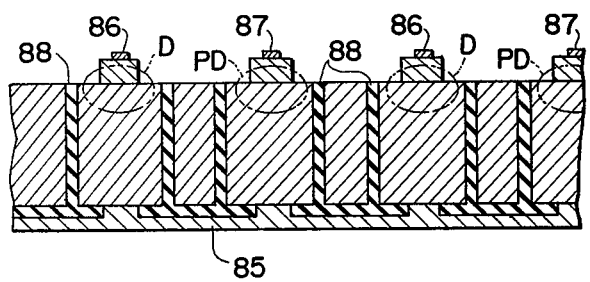
Figure 8F:
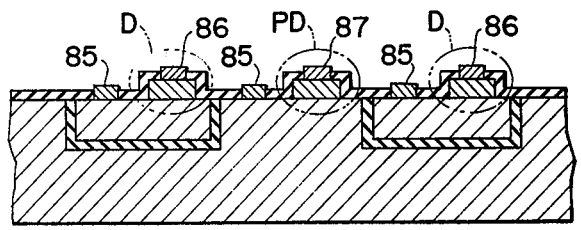
Figure 9:
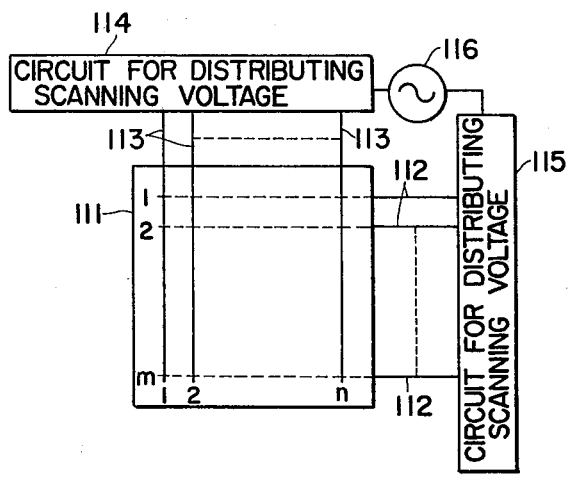
Figure 10:
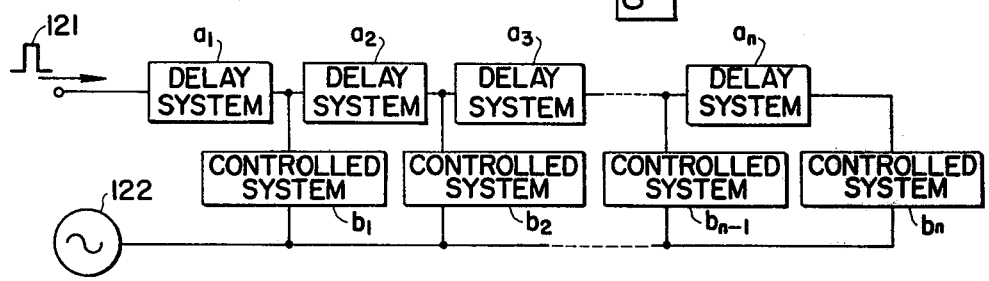
Figure 12A:
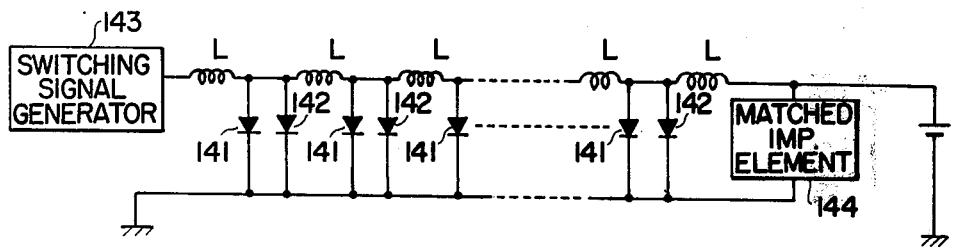
Figure 12B:
Figure 13A:
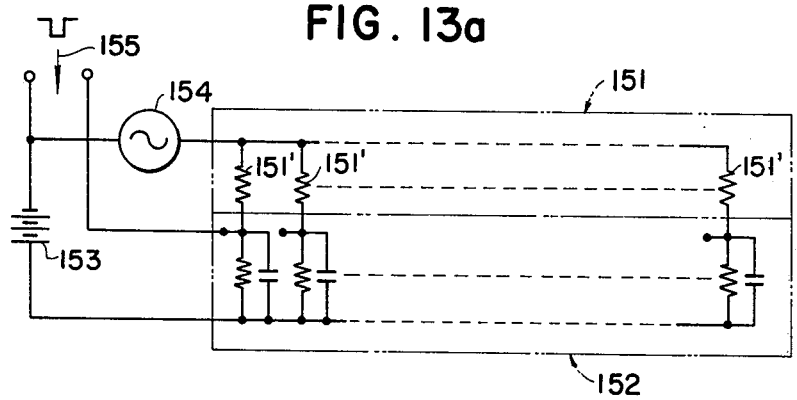
Figure 13B:
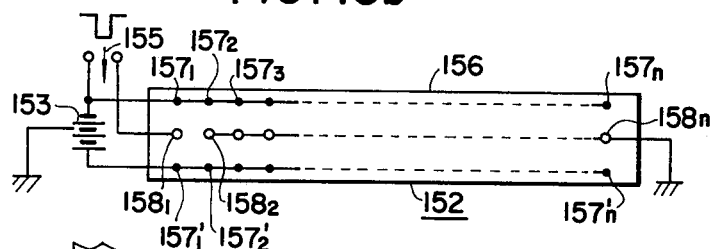
Figure 14A:
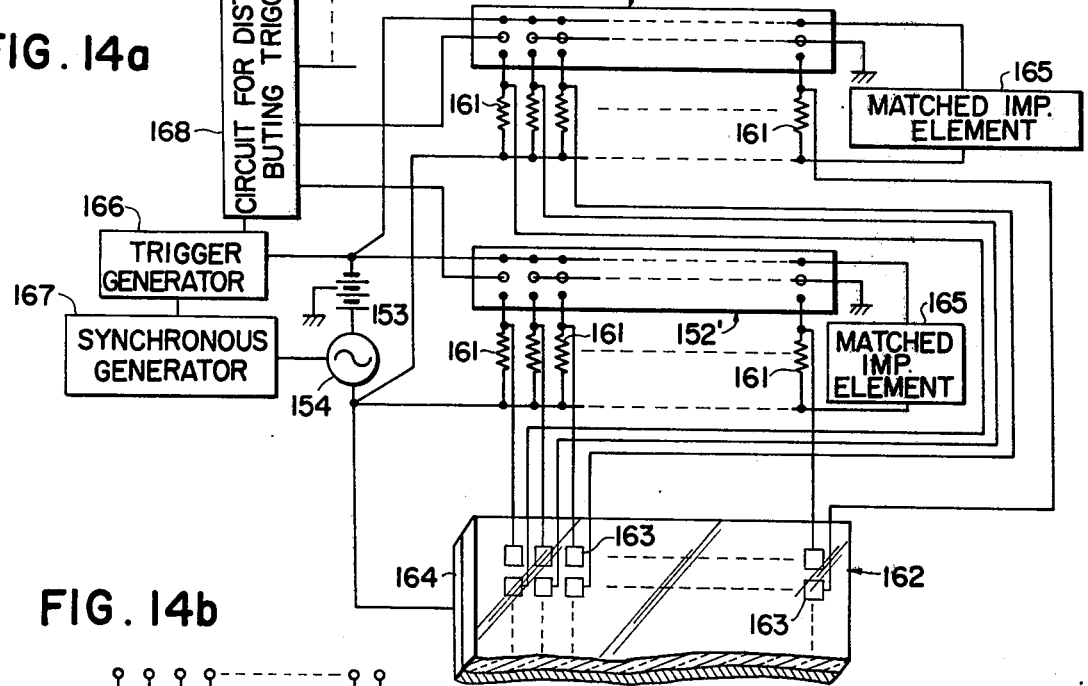
Figure 14B:
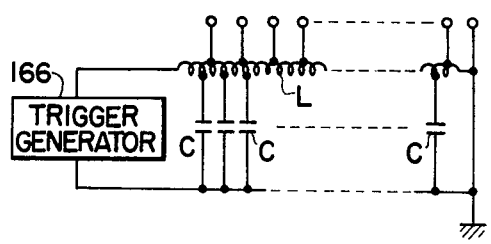
Figure 15A:
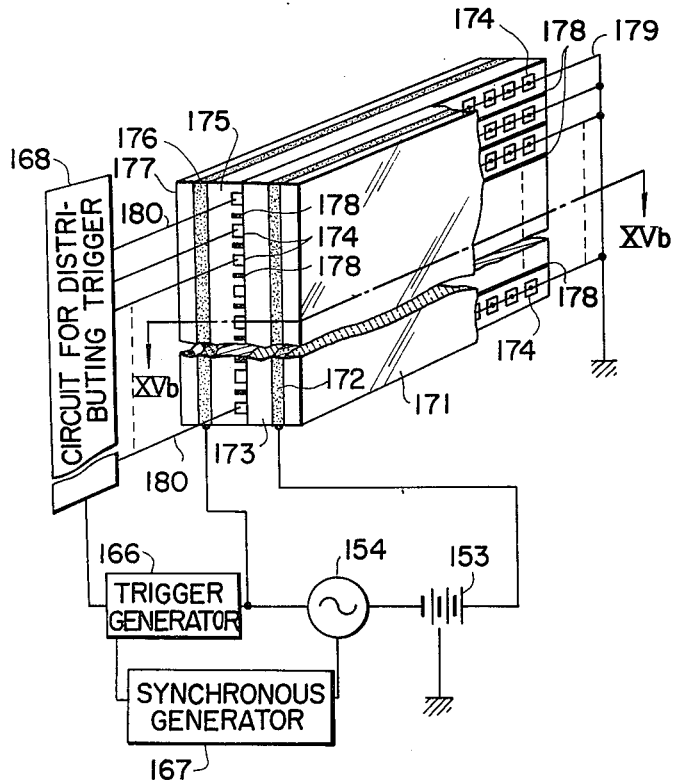
Figure 15B:
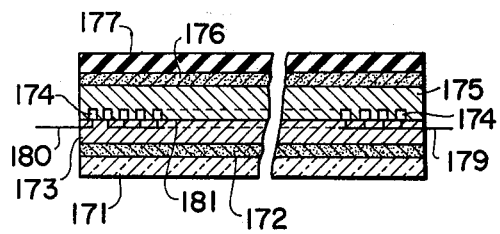
Figure 16:
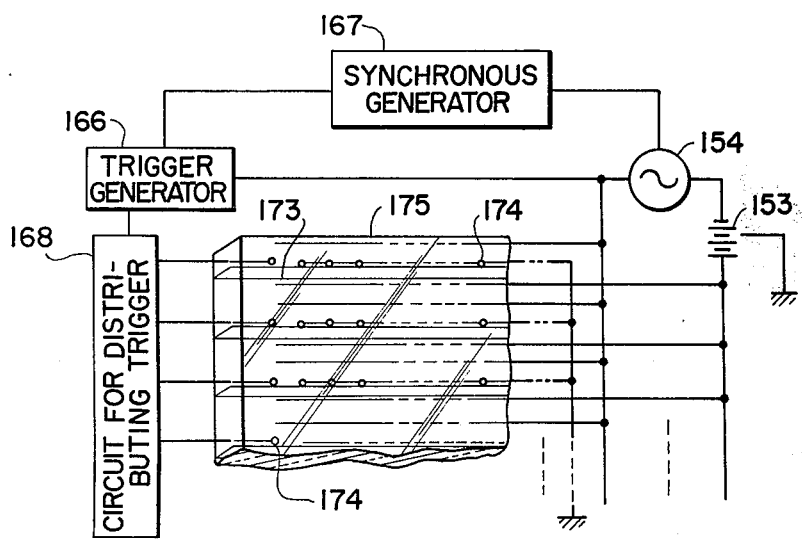

FIG. 6c shows a circuit arrangement of a trigger distribution circuit used in FIG. 6a;

FIGS. 8a to 8d show sections of an integrated construction relating to the circuit shown in FIG. 3b;

FIG. 8e and 8f show sections of other integrated constructions;

FIG. 9 is a schematic showing of a conventional signal distributing device;

FIG. 10 is a block diagram for illustrating the principle of this invention;

FIGS. 11a to 11d inclusive are circuit compositions of the block diagram shown in FIG. 10;

FIG. 12is another embodiment of this invention;

FIG. 12b is waveforms of voltage pulse appearing in the circuit shown in FIG. 12a;

FIG. 13a is an equivalent circuit diagram of another embodiment of this invention for explaining the principle thereof;

FIG. 13b is a concrete circuit composition of an active transmission line which is a component of FIG. 13a;

FIG. 14a is an example of another embodiment operating in accordance with the principle illustrated in FIG. 13a;

FIG. 14b illustratese a delay line as the distributing circuit of FIG. 14a;

FIG. 15a is a further embodiment of the present invention and FIG. 15b is a sectional view shown along a line 15b—15b in FIG. 15a;

FIG. 16 is an additional panel construction in accordance with the present invention.

Figure 1:
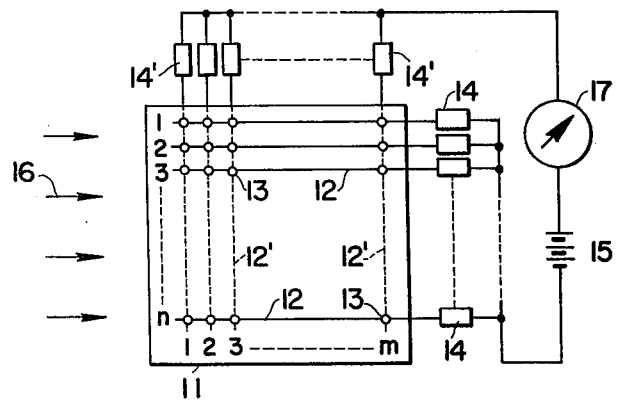
FIG. 1 is a diagram showing an example of the conventional signal collecting device.

FIG. 1 shows a fundamental configuration of an image pick-up device used as a conventional signal collecting device. A plurality of lateral and longitudinal transparent conductive bands 12 and 12', respectively, provided with a plurality of elements 13 located at the points of apparent intersection between the two conductive bands and responsive to radioactive rays are arranged in a matrix of $n$ lines and $m$ rows on a base panel 11. Selector switches 14 and 14', respectively, are provided for the switching of the lateral and longitudinal conductors. A DC power source 15 and a detector 17 are connected in series to the selector switches 14 and 14' to provide a plurality of detector circuits for detecting radiation from input radioactive rays 16.

The image pickup device composed in the manner mentioned above causes each of the radioactive ray sensitive elements to vary its resistance value according to the intensity of the radioactive rays 16 to which it is subjected. Under this condition, when the conductor selector switches 14 and 14' connected in series to common ray sensitive elements are switched successively, each ray sensitive element on base panel 11 is scanned and signals corresponding to the intensity of incident radioactive rays can be obtained on detector 17. Said radioactive rays generally consist of rays of visible light, heat rays or X-rays.

A noticeable problem with the image pickup device of the type described in connection with FIG. 1 lies in the conductor selector switches 14 and 14'. In other words, a selector switch of high speed must be provided if each ray sensitive element on base panel 11 is to be scanned. And further, signal-to-noise characteristics of the signals obtained from said device must be considered as a serious problem. These problems have long been recognized as a major obstruction against realization of a successful practical application of such image pickup device.

A mechanical switch such as a relay, has hitherto been used for a conductor selector switch with known arrangements, but without acceptable results. The mechanical switch has sufficiently good signal-to-noise characteristics; however, it can be of only little practical value when considering its mechanical complexity and the difficulties encountered not only in lowering its cost of manufacture and in constructing it into a compact size, but also in extending its service life, and particularly in achieving high speed operation. Besides the mechanical switch, electrical switches incorporating photoconductive cells wherein ON–OFF action is obtained by means of light have been used. This type of switch, however, has the disadvantage of poor signal-to-noise characteristics. There is also a method using a delay line as a means to control the scanning pulses by which each sensitive element on base panel 11 is scanned. This method, however, has little practical value in view of the available delay time provided by most delay lines. It is noted that delay time of a delay line is normally 2 to 3 microseconds per meter; whereas, a scanning from the left end to the right end of the face plate of a television, for example, in accordance with accepted standards requires a velocity of approximately 64 micro-seconds. To attain such a delay time, a considerably long deelay must be provided. This is the reason why the abovementioned method using a delay line has not been practicable to date.

What is described above is an example of the conventional defects inherent in known image pickup devices. Generally, it can be said that known devices which are to perform switching operations successively on plural signal sources will have one or more of the defects mentioned above. Further details of the present invention which solves this problem will now be described.

Figure 2:
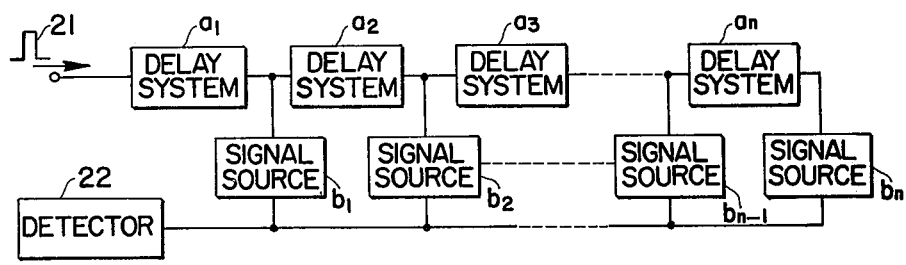
FIG. 2 is a block diagram illustrating the principle of the present invention.

In FIG. 2, a switching control system is provided including delay systems $a_1, a_2 \ldots a_n$ in the form of active transmission lines connected to signal sources $b_1, b_2 \ldots b_n$. A switching signal 21 is applied to the control system by which said signal sources are properly switched from one to another successively. A detector 22 is provided at the output of the system by which signals delivered from said signal sources are detected.

Operation of the above system is as follows:

Assume that switching signal 21 is transmitted to signal source $b_1$ through delay line $a_1$ whereby signal source $b_1$ is switched on. By this operation a signal from signal source $b_1$ is detected at detector 22. At this time signal sources $b_2 \ldots b_n$ are not switched on due to the presence of delay system $a_2$ and, therefore, no other signals are detected at detector 22 at this time. Then, switching signal 21 after a delay time determined by delay system $a_2$ will switch on signal source $b_2$. At this time, because the signal sources other than signal source $b_2$ are not operated upon by the switching signal, detector 22 detects only the signal from signal source $b_2$. Thus, signals from the signal sources are successively detected by detector 22 at intervals determined by the delay times of delay systems $a_1, a_2 \ldots a_n$. By this operation, in effect, the signal sources $b_1$ through $b_n$ are successively scanned by each applied switching signal 21 so that the state thereof or information stored therein or other data is sequentially applied to detector 22.

FIG. 3a illustrates a circuit arrangement of an embodiment of the present invention utilizing the principles described in connection with FIG. 2, where $a_1, a_2 \ldots a_n$ represent active transmission lines (corresponding in function to the delay systems $a_1$–$a_n$ in FIG. 2) consisting of parallel circuits each comprising an inductance element L, a capacitive element C and negative resistance element D (e.g. a tunnel diode). These circuits $a_1$ through $a_n$ are connected respectively in the form of a T-shaped transmission element with one-half of each inductance L serving as the series input and output elements and the capacitor C and diode D serving as the parallel element thereof. Signal sources $b_1, b_2 \ldots b_n$ are composed, for example, of radioactive ray sensitive elements 34 to which transistor switches $TRS_1, TRS_2 \ldots TRS_n$ are respectively connected in series. A switching signal generator 31 is connected to the input of the line to the parallel transmission circuits, a signal detector 32 is connected to the output of each of the transistor switches, and a matched impedance element 33 by which reflection of switching signals is prevented is connected in parallel with the last of the transmission circuits $a_n$.

Switching signals delivered from the switching signal generator 31 are delayed in the manner previously described, through the active transmission lines composed of $a_1, a_2 \ldots a_n$, so as to be transmitted at a constant propagation velocity from switching signal generator 31 to reflection preventing matched impedance element 33. When a switching signal is transmitted to active transmission line element $a_1$, the base of transistor $TRS_1$ of signal source $b_1$ is made positive, and said transistor switch $TRS_1$ becomes conductive. The resistance value, for example, of radioactive ray sensitive element $b_1$, which is to serve as a signal source, is changed according to the intensity of the radioactive rays to which it is subjected. This change in resistance is transformed into a change of current with the operation of switching transistor $TRS_1$ and detected at signal detector 32. A switching signal is then transmitted to active transmission line $a_2$ whereby transistor switch $TRS_2$ connected to radioactive ray sensitive element $b_2$ is made conductive and the signal from radioactive ray sensitive element $b_2$ is detected at signal detector 32. By the same process, transistor switches $TRS_3, TRS_4 \ldots TRS_n$ are successively made conductive and signals are obtained successively from the radioactive ray sensitive elements $b_3, b_4 \ldots b_n$ associated therewith. Besides radioactive ray sensitive elements, other elements may be used as a signal source, such as electrically responsive, magnetically responsive or various other types of energy responsive elements.

Thus, in the embodiment of FIG. 3a, the intensity of energy detected by elements $b_1$ through $b_n$ is determined by the magnitude of the current capable of passing therethrough, and samples of these currents are obtained by a successive operation of transistor switches $TRS_1$ through $TRS_n$ by a switching signal propagating in the active transmission line. The resulting signal detected by detector 32 will have a sequential variation in amplitude corresponding to the intensity of the sequential samples of energy detected by elements $b_1$ through $b_n$.

FIG. 3b provides a variation of the system of FIG. 3a, which uses active transmission lines $a_1, a_2 \ldots a_n$ only as switching signal transmission lines and provides transistor switches $TRS_1, TRS_2 \ldots TRS_n$ to perform the switching function. In contrast, in FIG. 3b, the ground wire of the active transmission line is utilized as one of the lines on which signals from signal sources (e.g. photodiodes $b_1, b_2 \ldots b_n$) are transmitted. In this way, the active transmission line serves to perform the switching operation as well as to convey switching signals. For example, a switching signal applied to the active transmission line consisting of elements $a_1$ through $a_n$ will switch the diodes D of each element to the conductive state in successive order. Then, by using diodes $b_1$ through $b_n$ of the transducer type, i.e., elements which will generate a current in response to receipt of illumination, a circuit containing a respective signal generator $b_1$ through $b_n$ will be completed from ground through detector 32, the generator $b$, the corresponding diode D connected thereto, and back to ground. Of course, diodes $b_1$ through $b_n$ could also be of the variable impedance type without change in the circuit operation if a voltage bias source is provided, for example, in series with detector 32. Thus, in this embodiment the active transmission elements $a_1$ through $a_n$ serve to delay the switching signal and also switch the signal generators.

Figure 3C:
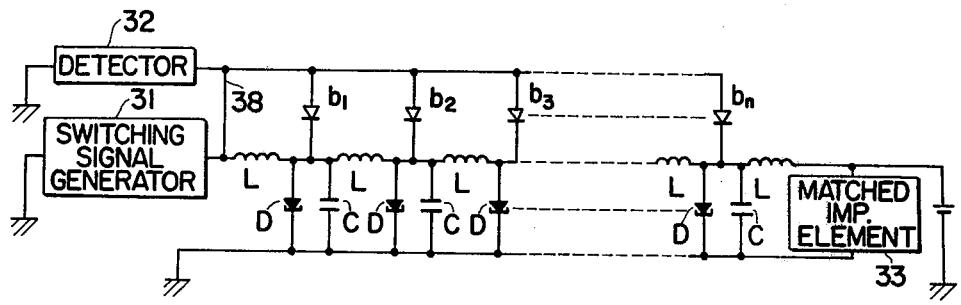

FIG. 3c is a modification of the embodiment of FIG. 3b. Similar reference designations as used in FIG. 3b are provided in FIG. 3c wherever possible to designate similar elements. A conductor wire 38 or similar element is provided to which the active transmission line and the signal transmission line are connected. In this scheme a switching signal is transmitted on an active transmission line and, at the same time, said switching signal is detected at the signal detector 32. Consequently, the switching signal thus detected at signal detector 32 can be a synchronizing signal which has a certain constant relation to the resulting signals from signal sources $b_1, b_2 \ldots b_n$ and may, for example, serve as an indication of the beginning of each scan of the photodiodes. For this reason, switching signals in the above operation are exceptionally suitable for use as the synchronizing signal required for the scanning in television or for the timing pulse in pulse transmission.

When the signal sources $b_1, b_2 \ldots b_n$ are arranged in a planer matrix form and radioactive ray sensitive elements 34 are composed of photoconductive elements (e.g. a photodiode) and further, when optical images are focused on a face of said matrix and each photoconductive element is scanned successively by a switching signal, a video signal can be obtained at signal detector 32. This particular scheme, therefore, makes it possible to accomplish a relatively simple and efficient image pickup device.

For the ray sensitive element serving as the signal source, a thermosensitive element (e.g. thermistor, semiconductor, etc.), a pressure sensitive element (e.g. a pressure is applied to the emitter junction of transistor, piezo-resistance element, etc.), a magnetic field sensitive element (e.g. Hall element, magnetic reluctance element, magnetic permeability responsive element, etc.), a storage element or other energy responsive device may be used. By the use of these different kinds of signal sources, the spacially distributed value of various kinds of energy can be measured. The signal detector used there is not limited to use as a measuring instrument, but may obviously act as a means of connection to transmitters, such as used for television and other systems. Note, there is no difference between said measuring instrument and said transmitter means with regard to their operations.

Figure 3D:
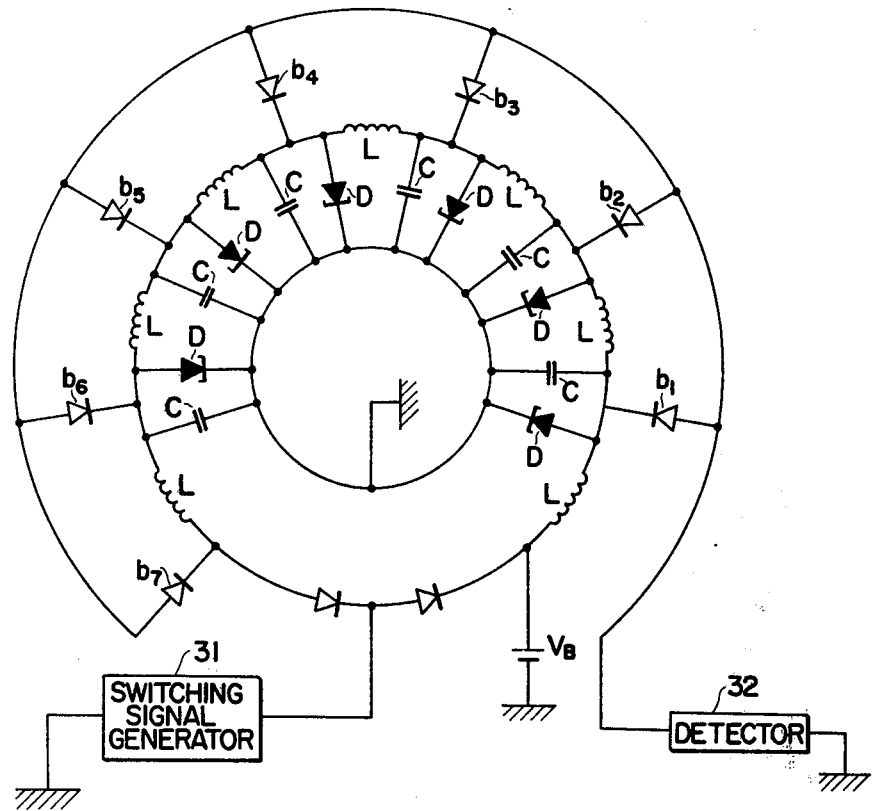

When an active transmission line is formed in a circular shape, as illustrated in FIG. 3d, and a switching signal is propagated along the circular transmission line, the time required for one complete circuit of the line is constant and very accurate, being determined by circuit constants of the line. Therefore, if a given point p is selected on the circular line, it becomes possible to measure a value, such as, illumination, temperature, etc., at said point at constant and very accurate time intervals.

In this way it also becomes possible by applying a continuous signal representing, for example, continuous variation in temperature, etc., to such a circular transmission line to obtain accurately spaced samples of the continuous signal due to the periodic switching of the line. That is, if the continuous signal is applied to a given point on the circular transmission line, the circulating switching pulse will extract a sample from the signal once during each complete circuit of the line. Thus, accurately spaced sampling of the signal can be accomplished.

When an active transmission line is disposed in the direction to which electro-magnetic wave or radioactive ray energy is permeant, the depth of permeance of the energy into the medium and changes in intensity due to the permeant depth can be determined simply and accurately. For example, if the depth of energy penetration in a substance is to be determined, samplings of energy intensity can be taken at various depths and applied to spaced points on a circular transmission line in the direction of propagation of the switching pulse therein. A signal will then be derived from the transmission line providing an accurate representation of the depth of energy penetration.

FIG. 4a is a schematic diagram of another embodiment of the present invention. Several embodiments of the present invention are presented above in which a switching signal is transmitted via an active transmission line and plural signal sources are switched by said switching signal thereby deriving signals from the signal sources in a predetermined progressive order. In these embodiments, the method employed is based upon the fact that the impedance of the elements of the active transmission line or the impedance of the signal source is changed by light, pressure or heat. For example, when a pressure is applied to Esaki diode D in the circuit of FIG. 4 from pressure terminal 42, the magnitude of the switching signals being propagated down the line is changed. This difference is amplified at transistor 41 which is also rendered conductive by the switching signal and can be detected at signal detector 32. In other words, the switching signal applied to the active transmission line from signal generator 31 performs two functions. First it serves to sequentially operate the transistors 41 as it propagates down the transmission line establishing a circuit in each case from ground through a current source, such as battery B, the detector 32, and a transistor 41 to ground. Of course, the magnitude of the current through the detector 32 will depend on the magnitude of the switching signal applied to transistor 41, so the second function of the switching signal is to regulate the signal current in accordance with the control provided by diodes D in the transmission line. An important feature of the transmission line is the fact that it has reshaping properties which enable attenuationless propagation down the line. Thus, as the switching signal is altered by each diode D in succession, it is reshaped by the line before passing to the next stage. In this embodiment the signal control element is not always limited to a diode D, but may also consist of an element such as a condenser or coil forming a part of the active transmission line, if its capacity or inductance is controllable by radioactive rays, pressure or heat.

Active transmission lines $a_1, a_2 \ldots a_n$ as utilized in accordance with the present invention may be used as lines by which switching signals are propagated but they may also be used as signal control elements utilizing their waveform reshaping properties as indicated above. Therefore, active transmission lines $a_1, a_2 \ldots a_n$ and signal sources $b_1, b_2 \ldots b_n$ can be used in combination as signal detecting means. In the embodiment of FIG. 4b, it is possible to control delay characteristics of signal transmission lines from the signal sources. In this case the delay time of the active transmission line is added to delay time of the signal transmission line provided by inductive delay elements L and, in consequence, the resulting transmission line can become a transmission line which apparently possesses a longer delay time than the addition of the delays which the two transmission lines possess individually.

Also, as indicated in connection with FIG. 4c, logic operation is readily possible at the same time that signal detection is performed; for example, in the case of an AND circuit or an OR circuit such may be accomplished by a proper means such as correspondingly changing the circuit structure or characteristics of the electric negative resistance element. For example, when the bias of an active transmission line is set at a certain suitable value and the switching signals is applied to both ends of the active transmission line, the switching signals thus applied collide with each other and are destroyed at the point of collision. This means that the electric negative resistance element being energized does not respond to signals until it is restored to a normal condition. In other words, the signal applied in said manner is not amplified but attenuated. For this reason it is necessary to set the bias at a proper value and to place said attenuated signal in the region of amplification of the electric negative resistance element if the attenuated signal is to be reamplified. If the value of the bias is below a certain limit, said attenuated signal is further attenuated to the point where it is destroyed. When the voltage-current characteristics at both sides of the collision point of the electric negative resistance element are differentiated and the bias voltage is set so that one of the two colliding signals is destroyed but the other is not destroyed, the signal is propagated in one direction after occurrence of the collision. This is defined as NAND operation. In the condition where an active transmission line is held in the form of a T-shaped circuit, even where switching signals are delivered from either one of the two terminals, the signal is carried to the other terminal. From this fact, it is noted that the T-shaped circuit acts to operate as OR circuit.

FIG. 5a illustrates a circuit exhibiting principles upon which another embodiment of the present invention is based, and FIG. 5b shows one example of the manner in which this circuit may be constructed. Radioactive ray sensitive element 51 is shown schematically in FIG. 5a with its internal equivalent resistance per unit length 51'. An active transmission line 52 possession neuristor characteristics (Refer to "A Neuristor Realization" appearing in the Proceeding of the IEEE, May 1964, pages 618 to 619) is associated with the ray sensitive element 51. The element 53 is a DC power source, the element 54 is a detector, and the elements 55 are trigger input terminals (control signal input terminals) for triggering the active transmission line 52.

The composition of the active transmission line 52 will now be described by referring to FIG. 5b. Minute ohmic contacts 57 and 57' are located in lines in such a manner that corresponding ones of the contacts 57 and 57' form an operational pair. For example, pairs are formed by $57_1$ with $57_1'$, $57_2$ with $57_2'$ ... $57_n$ with $57_n'$ and additionally a pair is formed between the individual ohmic contacts 57 and 57' and the mesa or planer part 58 which is of a particular conductivity type (e.g. N type) and is of an inverse type to base body 56 whose upper portion above the mesa parts 58 may, for example, be doped so as to be ray sensitive. Thus, by the use of a pair of ohmic contacts $57_1$ and $57_1'$ and mesa part $58_1$, a double base diode results in having one portion which is ray sensitive. In accordance with the invention a voltage is supplied from DC power source 53 to the pairs of ohmic contacts 57 and 57' of each double base diode. Still further, an operating trigger pulse is supplied to the portion located between mesa part $58_1$ and the ohmic contact $57_1$ of the first double base diode located at one extreme end of active transmission line 52; while, mesa parts $58_2$, $58_3$ ... $58_n$ of the double base diode located at said one end are connected by a common wire. Still further, a bias voltage is applied via ground between said other mesa parts and the ohmic contact of the base.

In the embodiment thus described, when a trigger pulse is applied to said first double base diode, current flows between ohmic contacts $57_1$ and $57_1'$ in accordance with the operating characteristics of the double base diode. This operation serves to trigger the second double base diode adjacent to said first double base diode which is composed of ohmic contacts $57_2$, $57_2'$ and mesa part $58_2$ after a certain specific delay time which is determined according to shape, dimensions, materials, etc. of the active transmission line. In this manner, operation is repeated at spaced intervals to trigger one double base diode after another whereby switching signals are propagated down the transmission line at a controlled rate without attenuation.

In FIG. 5a, since the internal resistance 51' of each corresponding portion of radioactive ray sensitive element 51 changes according to the quantity of input radioactive rays received thereby, signal current passing between a pair of contacts corresponding to the quantity of input radioactive rays is detected by detector 54 if the double base diode associated with the portion of the radioactive ray sensitive element 51 to be detected is in operation. Therefore, by physically arranging said radioactive ray sensitive element 51 in a matrix form and by scanning the face plate of the matrix with a switching signal in the manner to repeat in order the line scanning of the radioactive ray sensitive elements which are aligned, a radioactive ray diagram can easily be converted into an electrical signal. This is one of the most useful features which the image pickup device possesses.

FIG. 6a shows an integrated panel construction partially cut away based on the operating principle illustrated in FIG. 5a. FIG. 6b is a sectional view of FIG. 6a taken along line 6b—6b. In Figures element 61 is a transport insulator, element 62 is a transparent conductive electrode, element 63 is a radioactive ray sensitive layer, elements 64 are semiconductive elements (e.g. N-type) embedded in a semiconductor layer 65 (e.g. P-type silicon), layer 66 is a conductive electrode and layer 67 is an insulator. The portion of the panel consisting of elements 62, 63, 64, 65 and 66 corresponds to a plurality of the arrangements shown in FIG. 5a integrated into a panel construction. The strips 70 serve as an insulating area by which plural active transmission lines installed in a plane are electrically isolated from each other. A conductive wire 71 is provided, as shown in FIG. 6b, by which trigiger pulses are applied to one end of the first semiconductor elements 64, and a common wire 72 is connected to the other elements 64 thereby applying bias thereto from battery 53. The layer 73 is an insulating film (e.g. $SiO_2$) provided between the common wire 72 and semiconductor layer 65. An image signal detector 54 is connected between layer 66 and power source 53 thereby detecting signals obtained by scanning a determined portion of the image face plate. A trigger generator 69 by which operating trigger pulses are generated in said plural active transmission lines is connected to a trigger distributing circuit 68 by which said trigger pulse is distributed and applied to a plurality of active transmission lines. This distributing circuit 68 can be composed, as indicated in FIG. 6c, of delay lines consisting of capacitors C and inductances L which will propagate a switching signal at a desired rate. In the abovementioned arrangement, an operation for converting a radioactive ray diagram into an electrical signal can easily be achieved by repeating line scanning in an orderly manner on the face plate 61 of the panel in the manner previously described in connection with FIG. 5a. Note that in the embodiment shown in FIG. 6a, because the composition is such that a scanning means is combined together with an image face plate, the construction can be made markedly compact and, by the aid of integrated circuit technique, it can easily be manufactured.

The operation of the arrangement of FIG. 6a is as follows: a radiation image pattern formed by rays 16 passes through the transparent face plate 61 and transparent conductor 62 so as to irradiate ray sensitive layer 63 providing a variation in the impedance of the material of layer 63 from point to point in accordance with the radiation pattern received. Thus, the impedance between the conductive layer 62 and the individual semiconductive elements 64, which impedance corresponds to the impedance 51' in FIG. 5a, varies in accordance with the incident radiation on that portion of layer 63. The semiconductive elements 64 correspond to the mesa parts 58 in FIG. 5a and the conductive layers 62 and 66 in contact with the semiconductor layer 65 provide for connection of the d.c. voltage from source 53 across the mesa parts 58 performing the function of the ohmic contacts 57 and 57' to thereby establish a series of double diodes across the panels. Thus, with application of a trigger pulse to the panel via the first line 71 from the distributor 68, a switching pulse will be propagated across the upper portion of the panel separated by insulating strip 70 at a constant rate without attenuation and the variation in impedance in the layer 63 between the conductive layers 62 and 65 in the area rendered conductive by the propagating switching signal will be detected as changes in current level by detector 54. The distributor 68 is designed to have a delay time such that a trigger pulse is applied to a succeeding line 71 at the time that the propagating switching pulse in the panel reaches the end of its path. In this way, successive scanning of each line is accomplished with accuracy.

FIG. 7 is another panel construction based on the principles described in connection with FIG. 5a. FIG. 6a shows a multi-layer panel-type construction while FIG. 7 shows an embodiment wherein band shaped radioactive ray sensitive elements 63 and active transmission lines 65 are alternately arranged in a plane. The operating functions for this embodiment are exactly the same as those for the embodiment shown in FIG. 6; however, in this embodiment, a high resistant material such as antimony sulfide ($Sb_2S_3$) may be used for the radioactive ray sensitive element 63. By the use of antimony sulfide, storing effects can be produced, as a result of which, an image pickup device of exceptionally high sensitivity can be built.

With regard to the embodiment of the present invention shown in FIG. 3b, an exemplary construction in which a photodiode and an active transmission line are associated into one body will now be described with reference to FIGS. 8a through 8d. FIG. 8a shows a partial sectional view of a structure arranged in the form of another panel construction incorporating photodiodes into plural active transmission lines. In this embodiment, some impurities are doped into a semiconductor base to form regions such as P regions 81 and N regions 82 between which grooves 83 are formed by a suitable process such as cutting, thereby isolating the P-N junctions from one another. Electrode 85 is mounted on each individual P region 81 and in like manner electrodes 86 and 87 are mounted on respective N regions 82 separated by a groove 84. Further, by controlling the concentration of said impurities, negative resistance diode D is formed between electrodes 85 and 86, and photodiode PD is formed between electrodes 85 and 87. Meanwhile, the groove 84 provides high resistance so that photodiode PD is isolated from negative resistance diode D which is formed on N region 82. Negative resistance diode D has capacitance C; while, by forming the electrodes to a certain suitable shape (e.g. bent line) such as illustrated in FIGS. 8c and 8d, as indicated in connection with electrode 85', an appropriate inductance is obtained. By the abovementioned construction, a switching signal transmission line is formed between electrodes 85 and 86 and a structure in which a combination of signal transmission lines and photodiodes is formed between electrodes 85 and 87.

By referring to FIG. 3b, it is apparent that the construction of FIG. 8a can be connected electrically to correspond to this circuit. For example, as seen in FIG. 8b, the contacts 86 forming one free end of diodes D can be connected to ground and the contacts 87 forming one free end of photodiodes PD (corresponding to diodes $b_1$ through $b_n$ in FIG. 3b) can be connected to a signal detector. The contacts 85 form the junction between the diodes D and the photodiodes PD and therefore upon being connected together, a switching signal can be applied thereto for propagation down the line. The insulating strips 89 divide the panel into a plurality of lines to which switching signals can be applied in timed sequence much in the same manner and by similar means as the distributing trigger arrangement 68 described in connection with the embodiment of FIG. 6a.

Further, said structure makes it possible to form crystals on a structure which is provided in the manner that insulation material or metal or other suitable substances are set in stripes or other suitable forms on a base made up of an insulation material or transparent panel or semitransparent panel, or semiconductor, etc.

FIGS. 8e and 8f show other embodiments of the present invention. In FIG. 8e, elements 88 represent structures where regions are isolated from each other by insulators or P-N junctions or the like and are used as a base panel on which crystals are formed to compose negative resistance diode D or photodiode PD. FIG. 8f shows a structure where electrode 95 and negative resistance diode D or photodiode PD are formed in a common plane. Inductance L can be increased when bent wire is used for electrode formation or when the electrode is coated with a thin magnetic film. Also, capacity C can be increased by interposing a material of large dielectric constant between the electrode and the base plate.

The above examples represent cases where negative resistance diode D or photodiode PD are separately formed. Besides said cases, other constructions can be obtained by such procedures as putting the two elements in layers. Namely, negative resistance diode D is grown between a base plate and a first growing layer, and photodiode PD is formed between a first growing layer and a second growing layer. Needless to say, these elements may be composed in a dotted form or strip form, in multiple layers. For said element formation, there are available various kinds of crystal semiconductor material such as simplex semiconductors (e.g. germanium, silicon) and semiconductor compound (e.g. GaAs; GaP), or a combination of these elements. Abovementioned embodiments can easily be accomplished by the use of integrated circuit techniques, and in addition, they can be constructed to be markedly compact and the resulting device can be exceptionally reliable.

As described above, the present invention utilizes an active transmission line which has neuristor characteristics, operated as a switching signal transmission line. As a result, the transmission velocity is always kept constant and, since switching signals are transmitted after waveform reshaping within the line itself, erroneous operation can be eliminated. In addition, as previously described with reference to operation of active transmission lines, the signal-to-noise ratio is distinctively good. This is because all parts other than those in operation are maintained in a cut-off state. Further, since the switching system of this invention has no mechanically moving parts, such as the mechanical switching means used heretofore, but is operated electrically, its structure is simple and its service life is long. And further, by the use of said active transmission line, far longer delay time (per unit length) can be obtained than that obtainable with the conventional delay line. Especially, in an active transmission line whose composition is shown in FIG. 5a, delay time per unit length can be extended to a remarkably great extent. Practically, when a distance between mesa parts 58 is made 2mm, a resulting delay time can become as long as 100/sec.

It will be understood that because of the features heretofore described the active transmission line of this invention serves to solve a problem which has long been considered impossible to overcome.

It is to be noted that an active transmission line possessing said features is utilized as an essential factor for the embodiment of a signal collecting device which forms a part of the present invention. The system described heretofore relates to what is called a signal collecting device, the function of which is to detect signals independently or in relation to time order by means of a signal detector, where spacially distributed quantities such as radioactive ray, electromagnetic field, heat, or the like quantities are used as signal sources. However, said device is not confined to that described above but, for example, by letting said signal sources act as a system to be controlled and also by letting said signal detector act as a control signal source, said device can be operated as a signal distributing device. The details of such a complementary device are described below. By the use of these two devices in combination and by conducting proper switching operations, what is called "A Signal Distributing and Collecting Device" can be obtained whereby the functions of the two are collectively provided in an overall system.

Referring now to FIG. 9, a signal distributing device of known construction utilizing electroluminescent techniques is illustrated. A number of conductive bands 112 and 113 are deposited or otherwise formed in parallel in a mutually orthogonal arrangement on respective sides of an electroluminescent panel 111. As is well known to those familiar with electroluminescent techniques, the application of a voltage, for example, from signal source 116, to a selected one of each of the lines 112 and 113, will result in a luminescing of the panel 111 in the area of the apparent cross over of the lines 112 and 113, and the lighted portion can be made to scan the entire surface of the panel 111 by selectively switching the signal source 116 from one to another of the conductive bands 112 and 113 in a timed sequential manner. When such an arrangement is proposed for use as a television viewing device, for example, the horizontal and vertical scanning time as controlled by the voltage distributing circuits 114 and 115, respectively, is determined by the standards accepted by the industry. Thus, by providing proper control over the switching of the lines 112 and 113 a viewing raster of visible light can be produced on the electroluminescent plate 111. As the spot of light produced at the point of apparent crossover of selective lines 112 and 113 is caused to sweep back and forth across the plate. The brightness of the luminescence produced on the plate 111, as is known, corresponds to the magnitude of the intensity of the given scanning voltage, for example, such as provided by signal source 116. Thus, the above-mentioned raster produced on the surface of the plate 111 can be transformed into an image pattern by selectively modulating the voltage applied from signal source 116 to the various lines 112 and 113 in accordance with the pattern which is to be reproduced.

While the possibilities of a display device such as described above in connection with FIG. 9 has been known for some time, serious difficulties have been encountered in connection with proper control of the switching operation as performed by the voltage distributing devices 114 and 115. In order to scan the conductive bands 112 and 113 on the electroluminescent panel 111, a high speed switching device is required. Mechanical switching devices were proposed for such a task; however, these mechanical components lack the high speed performance in the stability and dependability of operation which is required for such a system. In addition, for apparent reasons, mechanical switching arrangements are necessarily of undesirably large size and complexity.

Delay lines have also been proposed as switching signal distributing means, as indicated above in connection with the signal collecting device of the present invention; however, the long delayed time required, for example, by the television industry, could not be produced by the ordinary delay line of sufficiently small size to be practically utilized in connection with such a system.

Another attempt to provide a satisfactory switching signal distributing means is based upon the use of photoconductive cells which are switched on and off by means of light beams. However, in such an arrangement, the inherent characteristics of the photoconductive cells make it impossible to achieve complete cutoff of the cells since the operation of the cell relies upon a change in internal resistance corresponding to the intensity of the received illumination. The result is inaccurate and undependable operation of the switching control.

It is therefore proposed in accordance with the present invention that the aforementioned active transmission line having neuristor characteristics is utilized to perform the switching function for the signal distributing system.

FIG. 10 provides an active transmission line similar to that disclosed in connection with FIG. 2, but with the exception that the elements $b_1$ through $b_n$ are systems to be controlled by application of a control signal from source 122 connected thereto. As in the previous embodiment, a switching signal 121 is applied to a series of delay systems $a_1$ through $a_n$ which form the active transmission line for control of the systems $b_1$ through $b_n$.

The operation of the system of FIG. 10 is as follows: When the switching signal 121 is applied to the controlled system $b_1$ through the delay systems $a_1$ thereby switching on the system $b_1$, the latter system is then controlled in its operation by the voltage supplied by control signal generator 122. At this particular time, the systems $b_2$ through $b_n$ are not controlled by the output of generator 122 because the switching signal 121 has not as yet propagated sufficiently down the delay line to switch these systems to the operating state. After a delay time determined by the delay of system $a_2$, the system $b_2$ is then switched on by the switching signal 121 and the voltage from control generator 122 is applied in control of this system. Once again, only the system $b_2$ is operated at this time since the switching signal 121 is no longer available to the system $b_1$ and has not as yet propagated sufficiently down the transmission line to reach the remaining systems.

Figure 11A:
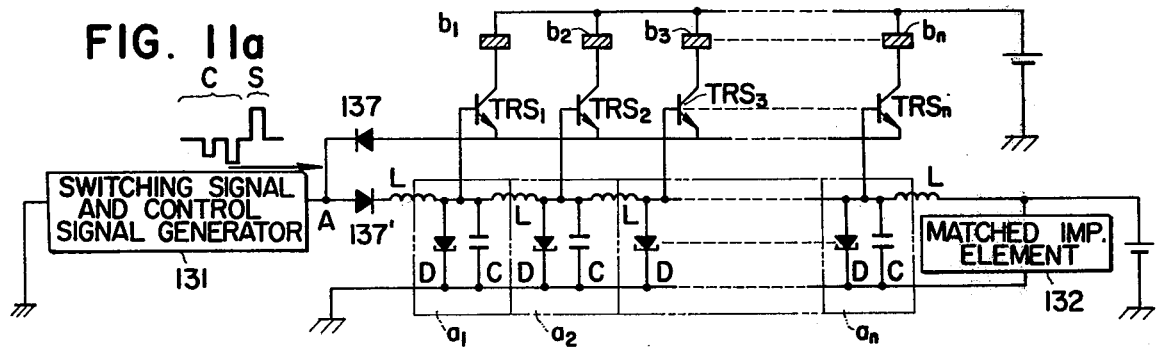

FIG. 11a discloses an embodiment of the present invention utilizing an active transmission line such as disclosed in connection with FIG. 10 consisting of a plurality of active transmission elements $a_1, a_2 \ldots a_n$, each consisting of series input and output inductances and a parallel combination consisting of a negative resistance diode, for example, a tunnel diode and a capacitor C formed into a transmission element of T-shape. The elements $b_1, b_2 \ldots b_n$ are systems to be controlled and may take the form of electroluminescent elements capable of being luminesced when a voltage is applied thereto. These controlled systems are respectively connected to transistor switches $TRS_1$ through $TRS_n$ between a source of voltage B and a signal generator 131 via diode 137. The signal generator 131, which generates both a switching signal and the control signals necessary for proper control of the elements $b_1$ through $b_n$, is also connected through a diode 137' to the input of the active transmission line. The diode 137' is poled in such a manner that the switching signal S from the generator 131, which is a positive signal, will pass only to the active transmission line, and the diode 137 is poled so that the control signals C, which are negative signals, will pass from generator 131 only to the transistors $TRS_1$ through $TRS_n$.

As indicated in connection with FIG. 10, the switching signal S supplied by generator 131 to the input of the active transmission line in FIG. 11a will propagate down the transmission line at a constant speed and without attenuation and will ultimately be absorbed in matched impedance element 132. As the switching signal S propagates down the transmission line, it will successively and at accurately timed intervals operate the transistors TRS. The control signals C provided by the signal generator 131 are separated by a time interval corresponding to the delay time between each of the active elements $a_1$ through $a_n$ in the active transmission line, so that as each of the transistors $TRS_1$ through $TRS_n$ are operated by the switching signal S propagating down the active transmission line, the appropriate control signal C corresponding to the individual controlled element $b_1$ through $b_n$ will be supplied at the junction A by the generator 131. The signal produced by the generator 131 may, for example, be the same signal which is detected by the signal detector provided in the signal collecting system, such as disclosed, for example, in connection with FIG. 3c. In this way, the proper spacing of the control signals C for application to the individual elements $b_1$ through $b_n$ is assured.

Since the elements $b_1$ through $b_n$ will be energized to a different intensity depending upon the magnitude of the control signals C applied thereto, it is apparent that a collection of these luminescent devices controlled in the manner indicated in connection with FIG. 11a can be made to produce an image pattern of visible light. Various panel arrangements for producing such a display will be described in greater detail hereinafter; however, it should be apparent that the controlled elements $b_1$ through $b_n$ need not be luminescent devices nor any other type of energy emitting device, but may take the form of any group of systems which are to be controlled in a sequential or particular order by impulses received on a composite input signal.

Figure 11B:
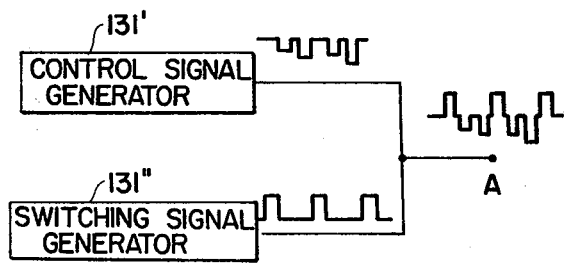

FIG. 11b indicates that the switching signal and control signal generator 131 of FIG. 11a need not take the form of a single unit but may be provided as a separate control signal generator 131' and a separate switching signal generator 131''. In such a case, the output from the two generators would be applied to a summing junction from which a composite signal may be derived.

Figure 11C:
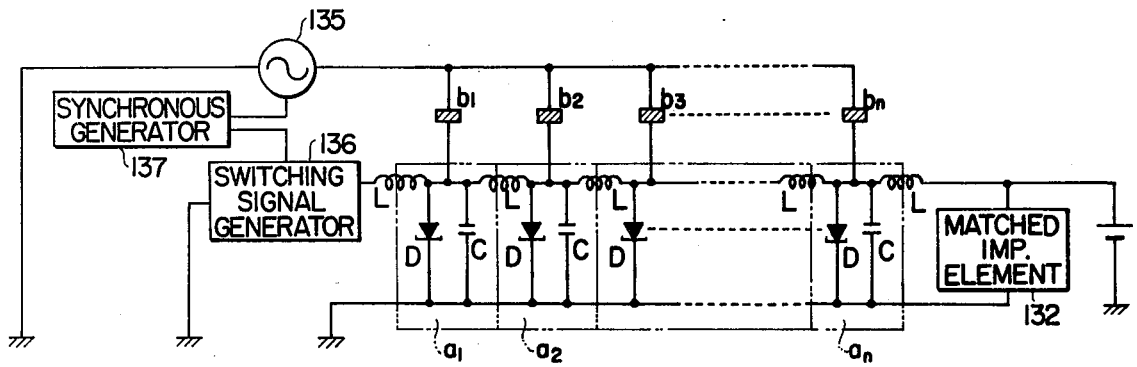

FIG. 11c is a modification of the circuit shown in FIG. 11a wherein the switching transistors $TRS_1$ through $TRS_n$ have been eliminated. Therefore, whereas in the embodiment of FIG. 11a the active transmission line consisting of transmission elements $a_1$ through $a_n$ serve to time the switching operation which was then carried out by the transistors, in the embodiment of FIG. 11c the transmission elements $a_1$ through $a_n$ carry out both the timing and the switching functions.

A control signal generator 135 is connected to each of the controlled elements $b_1$ through $b_n$ and a switching signal generator 136 is connected to the input of the active transmission line for application for switching control signals thereto. In this embodiment, a synchronous generator 137 is connected to both the control signal generator 135 and the switching generator 136 to synchronize the operation of the two signal generators. When the control signal provided by generator 135 takes the form of a video signal, such as used for television, the switching signal generator 136 may be controlled directly from the signal generator 135 by the synchronizing signal forming an integral part of the composite video signal.

The switching signal applied to the active transmission line from switching signal generator 136 successively switches the diodes D to their conductive state completing a circuit from ground through the control signal generator 135 a selected luminescent element b the corresponding diode D and back to ground. The intensity of the illumination produced by the element b is controlled by the magnitude of the signal applied thereto from generator 135.

In the same manner as described in connection with FIG. 4b relating to the signal collecting device of the present invention, the system of FIG. 11c may be modified to include delay elements in series with the controlled elements b thereby providing an increased delay time over that which is available from the active transmission line alone. The system would then in effect consist of a switching signal transmission line including transmission elements $a_1$ through $a_n$ and a control signal transmission line consisting of the controlled elements $b_1$ through $b_n$ in series with the inductive delay elements. In such an arrangement including both a switching signal transmission line and a control signal transmission line, if the transmission characteristics of the two transmission lines are made equal, additional control over the system can be obtained by applying two control signals thereto having pulses of different duration. If under these circumstances the magnitudes of the two signals are selected so that luminescence will be obtained only when both signals are simultaneously impressed upon the luminescent element, the duration of luminescence can be controlled by merely controlling the phase of the two signals with respect to one another. In other words, if the phase of the two signals is controlled so that they completely overlap one another, the duration of luminescence will be controlled only by the signal having the longest duration. However, maximum duration of luminescence can be obtained if the phase of the two signals is adjusted so that they are additive in duration so that luminescence begins under control of one of the signals and continues under the control of the next signal.

Figure 11D:
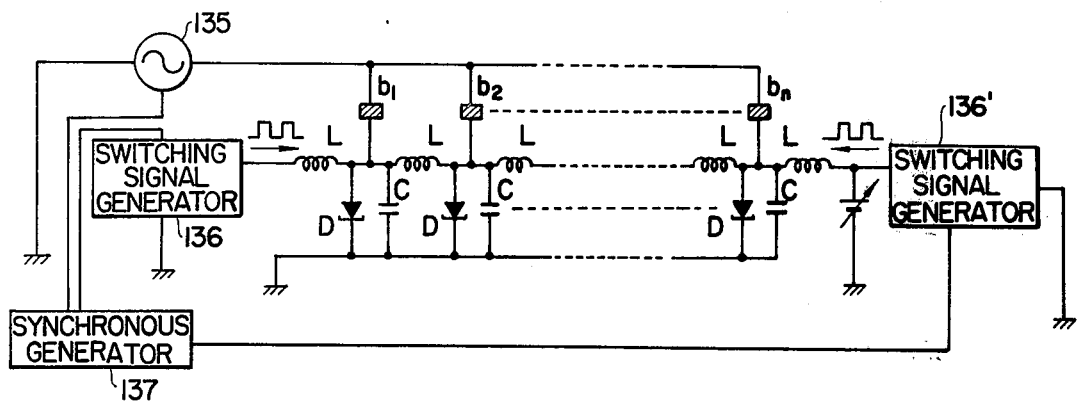

FIG. 11d is a schematic circuit diagram showing another embodiment of the present invention in the form of a modification of the circuit illustrated in FIG. 11c. In the case of this embodiment, an additional switching signal generator 136' is provided at the output of the active transmission line in place of the matching impedance element 132 and serves to apply a switching signal to the end of the active transmission line in sychronism with the switching signal applied to the input thereof by switching signal generator 136. Synchronization between the two signal generators 136 and 136' is provided by the synchronous generator 137, which is also connected to the control signal generator 135. With switching signals impressed on both ends of the active transmission line the signals will propagate in opposite directions toward the center of the line and will collide at this point and will be destroyed if an appropriate bias is applied to the transmission line. This is due to the fact that the negative resistance elements in the state of excitation will not respond to signals until the elements are restored to their normal state. In other words, while the negative resistance element is in its excited state, signals applied to the element are merely damped without being amplified. Therefore, in order for such damped signals to be reamplified to allow them to progress beyond the point of collision, they must be located within the amplifying region of the negative resistance element. Therefore, by providing a bias on the transmission line which will insure destructive collision of the two pulses at the center of the line, a scanning of the luminescent elements $b_1$ through $b_n$ is achieved from opposite ends of the line toward the inside of the line and luminescent elements are successively switched to provide two separate and distinct scanning patterns. If at the same time a control signal is provided by generator 135 to each of the luminescent elements, a single control pulse will energize two luminescent elements located at corresponding positions on opposite sides of the center line of the device so that a first luminescent pattern and a second invert luminescent pattern will automatically result from this operation. If the luminescent elements are formed into a display panel and switching pulses are applied to both ends of the active transmission line in the manner described above, two separate complementary image patterns will be produced.

FIG. 12a is another embodiment of the present invention wherein an active transmission line consists of the parallel combination of transmission elements including series input and output inductances L connected to the parallel combination of diode 141, having a negative resistance characteristic, such as provided by an Esaki diode, and a luminous element 142, which may for example take the form of a Laser diode, which transmission line is connected to a switching signal generator 143. A matched impedance element 144 is connected to the end of the transmission line for preventing the reflection of the switching signal. In this embodiment, each luminescent element 142 is successively operated by the switching signal as it propagates down the transmission line with constant speed and without attenuation. While the luminescent element 142 is illustrated as being connected in parallel with the negative resistance diode 141, it should also be apparent that this element can be connected in series with the diode.

As mentioned above, the negative resistance diode 141 does not always respond to the switching signal, but will attenuate the switching signal if this signal is applied while the diode is in its energized state. It is known that the negative resistance diode has a zone of no response in its characteristic. Utilizing this feature, when a pulse $P_1$ having a large width is applied, as shown in FIG. 12b, to the input of the transmission line, this pulse can be converted into a plurality of pulses $P_2$ of smaller width by virtue of the characteristic of the diode 141. By way of experimentation it has been found that with a transmission line having a characteristic impedance $Z_0$ of approximately 300 ohms, a time constant of approximately 160 milliseconds and a bias voltage of approximately 20 millivolts, if the interval between the input pulses is more than 19 microseconds, all of the pulses will be propagated without destruction; however, if the interval is less than 19 microseconds, only the first input pulse and the subsequent pulses spaced at 19 microseconds therefrom will be allowed to proceed without destruction. All of the other pulses located between the pulses of 19 microsecond spacing will be destroyed. Consequently, under such conditions, the interval between input pulses $P_2$, as shown in FIG. 12b, can accurately be controlled depending upon the constance of the system to a particularly accurate spacing. Using this principle, a plurality of luminous elements 142 may be luminesced at the same time by properly selecting the relation between the positions of the luminous elements 142 and the pulse intervals. Where a Laser diode is used as a luminous element it is necessary that the threshold current exceed a certain specific value to cause the diode to produce an output beam of energy. To comply with this requirement, a device may be constructed so that part of the light beam radiated from the diode is applied to the succeeding diode to decrease the threshold current level thereof. A Laser-ray may therefore be obtained thereby having the same intensity as provided by the preceding diode even if the input signal supplied thereto is attenuated.

As indicated above in connection with the signal collecting system of the present invention, the active transmission line can be formed into various shapes to perform various functions, and further, it is possible to perform logical operations with such a device by appropriately designing the circuit composition and the characteristics of the switching arrangement. For example, with the arrangement disclosed in connection with FIG. 11d, wherein switching signals are provided at both ends of the active transmission line and are propagated toward the center of the line where they collide with each other, by differentiating the voltage current characteristics of the two groups of negative resistance elements respectively located on both sides of the point of collision, if the bias voltage is selected so that one of the signals is not destroyed in the collision, but is transmitted in one direction after the collision, a NAND operation is obtained. Also, if the active transmission line is formed into a Y-shape, application of a switching signal to one or the other of two legs of the transmission line will produce an output at the third leg; however, application of switching pulses simultaneously to two legs of the transmission line will result in a collision at the junction producing no output from the third leg. Thus, an OR operation is obtained.

FIG. 13a is a schematic circuit diagram similar to that of FIG. 5a but relating to the signal distributing device of the present invention. This schematic diagram differs from that of FIG. 5a in that the signal detecting device of the previous embodiment is now replaced by a signal generating means 154 providing a composite signal, such as a video signal, capable of effecting luminescence of electroluminescent element 151. In FIG. 13a, the elements 151' indicate the various portions of electroluminescent element 151 and 152 as an active transmission line having neuristor characteristics such as indicated in the above-referenced publication of IEEE. In the manner heretofore described, a switching trigger pulse 155 applied to the active transmission line serves to successively energize the double base diodes arranged in parallel across the combination so as to complete the circuit through the various portions of the electroluminescent material providing for excitation thereof to produce varying degrees of luminescence corresponding to the magnitude of the signals provided by video signal generator 154.

FIG. 13b provides for a construction embodying the principles illustrated in connection with FIG. 13a wherein the material of base 156 may, for example, be P-type silicon upon which are disposed in linear arrangement a plurality of Mesa parts 158 of opposite conductivity type, for example, N-type. Ohmic contact 157 and 157' are disposed in linear arrangement on either side of the Mesa parts and corresponding ones thereof form pairs which cooperate with the intervening Mesa part to form a double base diode. This arrangement is similar to that disclosed in connection with FIG. 5b with the exception that the transmission line is associated with electroluminescent elements rather than ray sensitive pickup devices.

FIG. 14a discloses a system wherein the switching arrangement disclosed in connection with FIG. 13a is utilized to control scanning of an electroluminescent panel. A panel consisting of an electroluminescent layer 162 having a conductive layer 164 deposited on one side thereof and a plurality of transparent conductive elements 163 arranged in matrix form on the opposite face thereof from the electrode 164. By providing a voltage between the conductive layer 164 and a selected electrode 163 the portion of the electroluminescent layer formed between the conductive layer 164 and the electrode will luminesce. In order to provide such selective luminescence and scanning thereof, the system provides in accordance with the present invention for a plurality of switching devices, such as the devices 152 and 152' associated with the two rows of electrodes 163 on the electroluminescent panel 162. Connected across the ohmic contacts on each of the switching arrangements 152 and 152' is video signal generator 154 and a source of bias voltage 153. The switching signal is applied to the switching arrangements from trigger generator 166 via a distributing circuit 168 which applies the trigger signal first to the switching arrangement 152' and then to the arrangement 152 so as to obtain a successive scanning of the two lines on the electroluminescent panel. The resistors 161 are provided in connection with the output from the switching arrangements so as to make available means for deriving a voltage from the control circuit for application to the electrodes 163. Each of the switching arrangements associated with a given electrode 163 consists of the video signal generator 164, bias voltage source 153, double base diode in the switching block, and resistor 161 which is connected back to the signal generator 154.

As the switching signal is applied to the first Mesa part on a switching block, the first double base diode is operated applying the voltage across the resistor 161 to the first electrode 163 of the first line of electrodes on the elctroluminescent panel. The switching pulse then propagates down the switching block so that the electrodes 163 are energized in order producing a sweeping of light across the face of the electroluminescent panel. The variation in luminescence at each point in the line of scan is regulated by the intensity of the signal emitted by the video signal source 154. When the scan reaches the end of the first line, the distributing circuit 168, which may take the form of the delay circuit illustrated in FIG. 14b, applies a switching signal to the first Mesa part on the switching block 152 thereby initiating the scanning of the second line of electrodes 163 on the electroluminescent panel. It should be apparent that further lines of contacts 163 may be provided on the electroluminescent panel with corresponding switching blocks provided for effecting switching of the electrodes therein.

When a television signal is used as the video signal derived from generator 154, because a synchronizing signal is formed in an integral part of the composite viedo signal, the synchronizing generator 167 connected both to the control generator 154 and the trigger generator 166 is unnecessary as is the trigger generator 166 itself. Another obvious modification of the arrangement of FIG. 14a may be made where current responsive luminous elements, such as a semiconductor Laser, is provided in the place of the voltage responsive electroluminescent panel described above. In this case, the output from the switching blocks 152 and 152' could be connected directly to the electrodes on the luminous elements.

FIG. 15a illustrates another embodiment of the present invention similar to that described in connection with FIG. 6a, relating to the signal collecting device of the present invention. The arrangement disclosed in FIG. 15a corresponds substantially identically to the previously described embodiment, but due to the fact that this embodiment serves as a signal distributing device, the layer 173 in the panel will be an electroluminescent layer capable of luminescing upon the application of a suitable voltage thereacross, rather than a ray sensitive element as previously described. In addition, in place of the detector a video signal generator is provided for application of a composite video signal between the conductive layers 172 and 176. The video signal generator 154 as well as the trigger generator 166 are synchronized by synchronous generator 167 for properly timed operation.

FIG. 15b provides a cross section of the panel of FIG. 15a indicating that the connection of the Mesa parts 174 is as indicated in FIG. 13b.

With this embodiment of the present invention conversion of electric signals into a television picture can be easily accomplished by successive line scanning producing a face scanning operation on the panel. The construction illustrated in FIG. 15a is especially advantageous since the required scanning system is incorporated into the construction of the panel itself so that the overall device can be made very compact and can be easily manufactured utilizing integrated circuit techniques.

FIG. 16 provides another embodiment of the present invention similar to that of FIG. 14a in that the video face is composed of a plurality of band shaped electroluminescent elements 173 alternating with active transmission lines 175. Thus, in this embodiment of the invention, the switching blocks which were provided separately in FIG. 14a have been incorporated directly into the face of the panel to form a composite construction.

While we have shown and described several embodiments in accordance with the present invention, it is understood that the same is not limited thereto but is susceptible of numerous changes and modifications as is known to a person skilled in the art and we therefore do not wish to be limited to the details shown and described herein but intend to cover all such changes and modifications as are encompassed by the scope of the appended claims.

We claim:
1. A transducer panel comprising
a first transparent conductive layer,
a transducer layer mounted on said first transparent conductive layer for converting one form of energy to another,
a semiconductive layer of one conductivity type having a plurality of semiconductive elements of another conductivity type embedded therein and disposed in linear spaced relation across one face thereof in contact with said transducer layer,
a second conductive layer mounted on with a face of said semiconductive layer,
a source of bias voltage connected all but the first semiconductive element in each line of elements embedded in said semiconductive layer, and generator and distributor means for applying a trigger signal to said first semiconductive elements in each line of elements in a prescribed timed sequence.

2. The combination defined in claim 1 wherein said transducer layer is comprised of radiation sensitive material capable of converting radiation into an electrical current.

3. The combination defined in claim 2 further including a detector means connected in series with said source of bias voltage between said first and second conductive layer for detecting the level of current conduction therebetween.

4. The combination defined in claim 3 wherein said generator and distributor means includes a delay line and a pulse generator, said first semiconductive elements being connected at spaced points along said delay line and said pulse generator being connected between one end of said delay line and said second conductive layer.

5. The combination defined in claim 1 wherein said transducer layer is comprised of electroluminescent material.

* * * * *